(12) United States Patent  (10) Patent No.: US 7,724,541 B2
Gracias et al.  (45) Date of Patent: May 25, 2010

(54) SELF-ASSEMBLED ELECTRICAL NETWORKS

(75) Inventors: David H. Gracias, Baltimore, MD (US); Joe Tien, Brookline, MA (US); George M. Whitesides, Newton, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 1135 days.

(21) Appl. No.: 11/352,923

(22) Filed: Feb. 13, 2006

(65) Prior Publication Data

US 2006/0191125 A1 Aug. 31, 2006

Related U.S. Application Data

(63) Continuation of application No. 09/909,420, filed on Jul. 19, 2001, now Pat. No. 7,007,370.

(60) Provisional application No. 60/219,570, filed on Jul. 20, 2000, provisional application No. 60/226,105, filed on Aug. 17, 2000.

(51) Int. Cl.
*H05K 7/06* (2006.01)
*H01L 49/00* (2006.01)
(52) U.S. Cl. .................... 361/810; 257/211
(58) Field of Classification Search ........... 257/202, 257/211; 361/805, 810
See application file for complete search history.

(56) References Cited

U.S. PATENT DOCUMENTS

| 4,016,456 | A |  | 4/1977 | Birks et al. |
| 4,499,607 | A |  | 2/1985 | Higgins |
| 5,075,253 | A |  | 12/1991 | Sliwa, Jr. |
| 5,355,577 | A |  | 10/1994 | Cohn |
| 5,512,131 | A |  | 4/1996 | Kumar et al. |
| 5,545,291 | A |  | 8/1996 | Smith et al. |
| 5,776,748 | A |  | 7/1998 | Singhvi et al. |
| 5,783,856 | A | * | 7/1998 | Smith et al. ............ 257/618 |
| 5,824,186 | A | * | 10/1998 | Smith et al. ............ 438/597 |
| 5,900,160 | A |  | 5/1999 | Whitesides et al. |
| 5,925,259 | A |  | 7/1999 | Biebuyck et al. |
| 5,976,953 | A |  | 11/1999 | Zavracky et al. |
| 6,001,232 | A |  | 12/1999 | Chu et al. |
| 6,180,239 | B1 |  | 1/2001 | Whitesides et al. |
| 6,355,198 | B1 |  | 3/2002 | Kim et al. |
| 6,507,989 | B1 |  | 1/2003 | Bowden et al. |
| 6,687,987 | B2 | * | 2/2004 | Mayer et al. ............ 29/832 |

(Continued)

FOREIGN PATENT DOCUMENTS

EP 0 481 362 A2 4/1992

(Continued)

OTHER PUBLICATIONS

Alivisatos, A.P. et al.,"Organization of 'nanocrystal molecules' using DNA," *Nature*, 1996, 382:609-611.

(Continued)

*Primary Examiner*—Evan Pert
(74) *Attorney, Agent, or Firm*—Wolf, Greenfield & Sacks, P.C.

(57) ABSTRACT

Techniques for self assembly of macro-scale objects, optionally defining electrical circuitry, are described, as well as articles formed by self assembly. Components can be joined, during self-assembly by minimization of free energy, capillary attraction, or a combination.

20 Claims, 3 Drawing Sheets

U.S. PATENT DOCUMENTS

| | | | |
|---|---|---|---|
| 6,974,604 B2* | 12/2005 | Hunter et al. | 427/301 |
| 7,007,370 B2 | 3/2006 | Gracias et al. | |
| 7,253,091 B2* | 8/2007 | Brewer et al. | 438/618 |

FOREIGN PATENT DOCUMENTS

| | | |
|---|---|---|
| EP | 0 491 059 A1 | 6/1992 |
| WO | WO 96/29629 A2 | 9/1996 |
| WO | WO 99/04440 A1 | 1/1999 |

OTHER PUBLICATIONS

Alivisatos, A.P., "Semiconductor Clusters, Nanocrystals, and Quantum Dots," Science, 1996, 272:933-937.

Boncheva, et al. "Biomimetic self-assembly of a functional asymmetrical electronic device," Proc. Natl. Acad. Sci. USA, 2002, 99(8):4937-4940.

Bowden et al., "Mesoscale self-assembly: capillary bonds and negative menisci," J. Phys. Chem B., 2000, 104(12):2714-2724.

Bowden et al., "Molecule-mimetic chemistry and mesoscale self-assembly," Acc. Chem. Res, 2001, 34(3):231-238.

Bowden et al., "Self-assembly of mesoscale objects into ordered two-dimensional arrays," Science, 1997, 276(5310):233-235.

Bowden et al., "Self-assembly of microscale objects at a liquid/liquid interface through lateral capillary forces," Langmuir, 2001, 17(5):1757-1765.

Breen et al, "Design and Self-Assembly of Open, Regular, 3D Mesostructures," Science, 1999, 284:948-951.

Choi et al, "Macroscopic, Hierarchical, Two-Dimensional Self-Assembly," Angew. Chem. Int. Ed. Engl., 1999, 38(20):3078-3081.

Gracias et al., "Forming electrical networks in three dimensions by self-assembly," Science, 2000, 289:1170-1172.

Harsh et al., "Solder self-assembly for three-dimensional microelectromechanical systems," Sensors and Actuators, 1999, 77:237-244.

Heath et al., "A Defect-Tolerant Computer Architecture: Opportunities for Nanotechnology," Science, 1998, 280:1716-1721.

Kralchevsky et al., "Capillary forces between colloidal particles," Langmuir, 1994, 10(1):23-36.

Miller, L.P./IBM, "Controlled Collapse Reflow Chip Joining," J. Res. Develop., 1969, pp. 239-250.

Mirkin et al., "A DNA-based method for rationally assembling nanoparticles into macroscopic materials," Nature, 1996, 382:607-609.

Rothemund, P.W., "Using lateral capillary forces to compute by self-assembly," Proc. Natl. Acad. Sci. USA, 2000, 97(3):984-989.

Syms et al., "Self-Assembly of Three-Dimensional Microstructures Using Rotation by Surface Tension Forces," Electronic Letters, 1993, 29(8):662-664.

Terfort et al., "Three-dimensional self-assembly of millimetre-scale components," Nature, 1997, 386:162-164.

Visscher, P.B. et al., "Self-Assembly in Model Magnetic Inks," IEEE Transactions on Magnetics, 1998, 34(4):1687-1689.

Whitesides et al., "Noncovalent synthesis: using physical-organic chemistry to make aggregates," Acc. Chem. Res., 1995, 28:37-44.

Yamaki et al., "Size-dependent separation of colloidal particles in two-dimensional convective self-assembly," Langmuir, 1995, 11(8):2975-78.

Yeh, His-Jen J. et al., "Fluidic Self-Assembly of Microstructures and its Application to the Integration of GaAs on Si," IEEE, 1994, pp. 279-284.

Alivisatos, A.P. et al., "Organization of 'nanocrystal molecules' using DNA", Nature, vol. 382, 1996, pp. 609-611.

Alivisatos, A.P., "Semiconductor Clusters, Nanocrystals, and Quantum Dots," Science, vol. 272, Feb. 16, 1996, pp. 933-937.

Boncheva, et al. "Biomimetic self-assembly of a functional asymmetrical electronic device," Proc. Natl. Acad. Sci. USA, vol. 99, No. 8, 2002, pp. 4937-4940.

Bowden et al., "Mesoscale self-assembly: capillary bonds and negative menisci", J. Phys. Chem. B, 2000, vol. 104, No. 12, pp. 2714-2724.

Bowden et al., "Molecule-mimetic chemistry and mesoscale self-assembly", Acc. Chem. Res., 2001, vol. 34, No. 3, pp. 231-238.

Bowden et al., "Self-assembly of mesoscale objects into ordered two-dimensional arrays", Science, 1997, vol. 276, No. 5310, pp. 233-235.

Bowden et al., "Self-assembly of microscale objects at a liquid/liquid interface through lateral capillary forces", Langmuir, vol. 17, No. 5, 2001, pp. 1757-1765.

Breen et al, "Design and Self-Assembly of Open, Regular, 3D Mesostructures", Science, 1999, vol. 284, pp. 948-951.

Choi et al, "Macroscopic, Hierarchical, Two-Dimensional Self-Assembly", Angew. Chem. Int. Ed. Engl., 1999, vol. 38, No. 20, pp. 3078-3081.

Gracias et al., "Forming electrical networks in three dimensions by self-assembly", Science, vol. 289, Aug. 18, 2000, pp. 1170-1172.

Harsh et al., "Solder self-assembly for three-dimensional microelectromechanical systems", Sensors and Actuators, 77, 1999, p. 237-244.

Heath et al., "A Defect-Tolerant Computer Architecture: Opportunities for Nanotechnology", Science, vol. 280, 1998, pp. 1716-1721.

Kralchevsky et al., "Capillary forces between colloidal particles", Langmuir, 1994, vol. 10, No. 1, pp. 23-36.

Miller, L.P./IBM, "Controlled Collapse Reflow Chip Joining", J. Res. Develop., May 1969, pp. 239-250.

Mirkin et al., "A DNA-based method for rationally assembling nanoparticles into macroscopic materials", Nature, vol. 382, Aug. 15, 1996, pp. 607-609.

Rothemund, P.W., "Using lateral capillary forces to compute by self-assembly", Proc. Natl. Acad. Sci. USA, vol. 97, No. 3, 2000, p. 984-989.

Syms et al., "Self-Assembly of Three-Dimensional Microstructures Using Rotation by Surface Tension Forces", Electronic Letters, 1993, vol. 29, No. 8, pp. 662-664.

Terfort et al., "Three-dimensional self-assembly of millimetre-scale components", Nature, vol. 386, Mar. 13, 1997, pp. 162-164.

Visscher, P.B. et al., "Self-Assembly in Model Magnetic Inks", IEEE Transactions on Magnetics, vol. 34, No. 4, 1998, pp. 1687-1689.

Whitesides et al., "Noncovalent synthesis: using physical-organic chemistry to make aggregates", Acc. Chem. Res., 1995, vol. 28, pp. 37-44.

Yamaki et al., Size-dependent separation of colloidal particles in two-dimensional convective self-assembly:, Langmuir, 1995, vol. 11, No. 8, pp. 2975-2978.

Yeh, His-Jen J. et al., "Fluidic Self-Assembly of Microstructures and its Application to the Integration of GaAs on Si", IEEE, 1994, pp. 279-284.

Yeh, His-Jen J. et al., "Self-Assembly in Model Magnetic Inks", IEEE, 1998, vol. 34, No. 4, pp. 1687-1698.

\* cited by examiner

SELF-ASSEMBLED ELECTRICAL NETWORKS

RELATED APPLICATIONS

This application is a continuation of U.S. patent application Ser. No. 09/909,420, filed Jul. 19, 2001 which claims priority to U.S. provisional application Ser. No. 60/219,570, filed Jul. 20, 2000 and U.S. provisional application Ser. No. 60/226,105, filed Aug. 17, 2000.

FEDERALLY SPONSORED RESEARCH

This invention was sponsored by NSF Grant No. CHE9901358. The government has certain rights in the invention.

FIELD OF THE INVENTION

The present invention relates generally to electrical circuitry, and more particularly to electrical circuitry formed via self-assembly.

BACKGROUND OF THE INVENTION

Self-assembly is a term used to define the spontaneous association of entities into structural aggregates. The best-known and most well-researched area of self-assembly involves molecular self-assembly, that is, the spontaneous association of molecules, a successful strategy for the generation of large, structured molecular aggregates. Self-assembly of molecules in solution is described by Whitesides, et al., in "Noncovalent Synthesis: Using Physical-Organic Chemistry to Make Aggregates", *Accts. Chem. Res.*, 28, 37-44 (1995). See also Philp, et al., *Angew. Chem., Int. Ed. Engl.*, 35, 1155-1196 (1996) for molecular self-assembly. Nature includes examples of molecular self-assembly where, in the field of biology, many processes involve interfacial interactions and shape selectivity to form complex, three-dimensional structures.

Self-assembly of molecules can be made to occur spontaneously at a liquid/solid interface to form a self-assembled monolayer of the molecules when the molecules have a shape that facilitates ordered stacking in the plane of the interface and each includes a chemical functionality that adheres to the surface or in another way promotes arrangement of the molecules with the functionality positioned adjacent the surface. U.S. Pat. No. 5,512,131 and U.S. patent application Ser. Nos. 08/659,537, 08/616,929, 08/676,951, and 08/677,309, and International Patent Publication No. WO 96/29629, all commonly-owned, describe a variety of techniques for arranging patterns of self-assembled monolayers at surfaces for a variety of purposes. See also Whitesides, G. M., "Self-Assembling Materials", *Scientific American*, 273, 146-149 (1995) for a discussion of self-assembly.

Self-assembly of components larger than molecules is known, for example, self-assembly of bubbles at an air-liquid interface, small spheres self-assembled on surfaces, self-assembly of microspheres via biochemical attraction between the microspheres, and the like. Yamaki, et al., in "Size Dependent Separation of Colloidal Particles in Two-Dimensional Convective Self-Assembly" *Langmuir*, 11, 2975-2978 (1995), report "convective self-assembly" of colloidal particles ranging in size from 12 nm to 144 nm in diameter in a wetting liquid film on a mercury surface. Size-dependent two-dimensional convective assembly occurred, with larger particles being positioned in the center of the aggregate and smaller particles at the periphery. Cralchevski, et al., in "Capillary Forces Between Colloidal Particles" *Langmuir*, 10, 23-36 (1994), describe capillary interactions occurring between particles protruding from a liquid film due to the capillary rise of liquid along the surface of each particle. A theoretical treatment of capillary forces active spheres is presented. Simpson, et al., in "Bubble Raft Model for an Amorphous Alloy", *Nature*, 237-322 (Jun. 9, 1972), describe preparation of a two-dimensional amorphous array of bubbles of two different sizes as a model of an amorphous metal alloy. The bubbles were held together by a general capillary attraction representative of the binding force of free electrons in the metal.

U.S. Pat. No. 5,545,291 (Smith) describes assembly of solid microstructures in an ordered manner onto a substrate through fluid transfer. The microstructures are shaped blocks that, when transferred in a fluid slurry poured onto the top surface of a substrate having recessed regions that match the shapes of the blocks, insert into the recessed regions via gravity. U.S. Pat. No. 5,355,577 (Cohn) describes a method of assembling discrete microelectronic or micro-mechanical devices by positioning the devices on a template, vibrating the template, and causing the devices to move into apertures. The shape of each aperture determines the number, orientation, and type of device that it traps.

While self-assembly at the molecular level is relatively well-developed, self-assembly at larger scales is not so well-developed. Many systems in science and technology require the assembly of components that are larger than molecules into assemblies, for example, microelectronic and microelectrochemical systems, sensors, and microanalytical and microsynthetic devices. Photolithography has been the principal technique used to make microstructures. Although enormously powerful, photolithography cannot easily be used to form non-planar and three-dimensional structures, it generates structures that are metastable, and it can be used only with a limited set of materials.

The fabrication of electronic devices is well established. Microelectronic devices are typically fabricated via photolithography, which is inherently a two-dimensional process. The three-dimensional interconnections required in state of the art microelectronics devices typically are fabricated by the superposition of stacked, parallel planes, and by their connection using perpendicular vias. While these arrangements have been very successful, they require numerous design considerations ranging from minimization of RC delays due to long interconnects, to dissipation of heat using cooling channels designed into three-dimensional structures.

U.S. Pat. No. 5,075,253 (Sliwa) suggests integration of segmented circuitry devices into two-dimensional arrangements using capillary forces at the surface of a floatation liquid.

Commonly owned, co-pending U.S. patent application Ser. No. 08/816,662, filed Mar. 13, 1997 by Bowden, et al., entitled "Self-Assembly of Macro Scale Articles", as well as the following literature references: Bowden, et al. "Self-assembly of mesoscale objects into ordered two-dimensional arrays", Science (Washington, D.C.) (1997), 276(5310), 233-235; Terfort, et al., "Three-dimensional self-assembly of millimeter-scale components", Nature (London) (1997), 386(6621), 162-164; Bowden, et al., "Mesoscale Self-Assembly: Capillary Bonds and Negative Menisci", J. Phys. Chem. B (2000), 104(12), 2714-2724; Bowden, et al., "Molecule-Mimetic Chemistry and Mesoscale Self-Assembly", Acc. Chem. Res. (2001), 34(3), 231-238; Bowden, et al., "Self-Assembly of Microscale Objects at a Liquid/Liquid Interface through Lateral Capillary Forces", Langmuir (2001), 17(5), 1757-1765, describe self-assembly of some electrical components, and self-assembly of some three-dimensional objects.

While the above and other arrangements are, in some cases, very promising, it would be desirable to introduce flexibility and variety into the possible techniques for fabricating three-dimensional circuitry.

SUMMARY OF THE INVENTION

The present invention provides techniques for self-assembly of component articles, and articles so assembled.

In one aspect, the invention provides a series of methods. One method involves allowing a first, a second, a third, and a fourth component to assemble in a non-planar arrangement of components, in the absence of any external net force applied to any of the first, second, third, or fourth components in the direction of any others of the first, second, third, or fourth components. Where each component includes portions of an electrical circuit, at least one electrical circuit can thereby be formed that traverses at least one portion of each of the first, second, third, and fourth components.

In another aspect, the invention provides a series of articles. In one embodiment, an article comprises a non-planar assembly of at least a first, a second, a third, and a fourth component. The components are constructed and arranged to have the ability, individually, in the absence of any external net force applied to any of the components in the direction of any others of the components, to form the assembly. The first, second, third, and fourth components can together define an electrical circuit that traverses at least one portion of each of the first, second, third, and fourth component.

Although electrical circuits are primarily exemplified herein, the invention is not so limited. The invention relates to methods of forming self-assembled structures and structures so formed regardless of whether they include electrical circuits or not.

Other advantages, novel features, and objects of the invention will become apparent from the following detailed description of the invention when considered in conjunction with the accompanying drawings, which are schematic and which are not intended to be drawn to scale. In the figures, each identical or nearly identical component that is illustrated in various figures is represented by a single numeral. For purposes of clarity, not every component is labeled in every figure, nor is every component of each embodiment of the invention shown where illustration is not necessary to allow those of ordinary skill in the art to understand the invention.

DETAILED DESCRIPTION OF THE INVENTION

Figure 1:
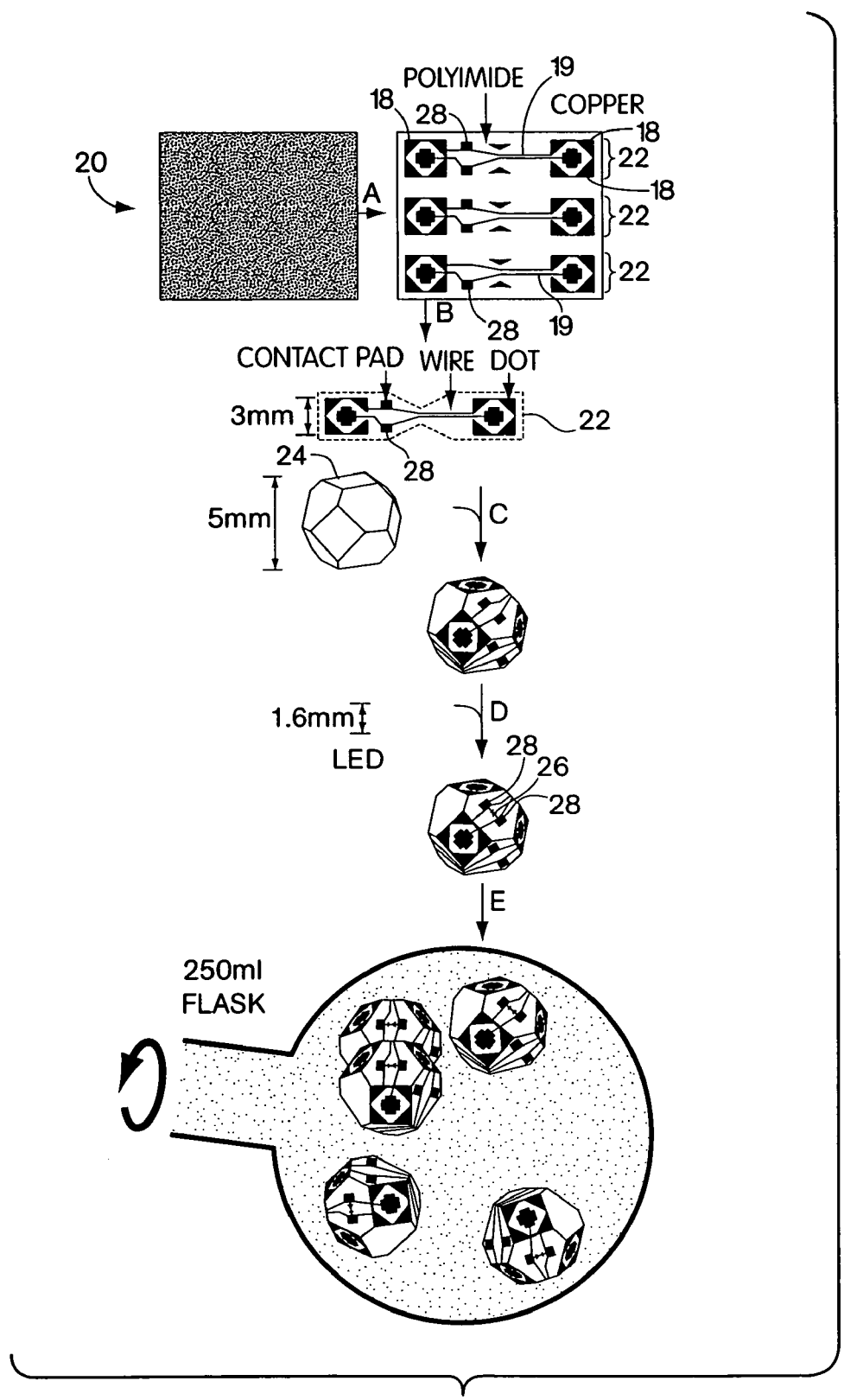
FIG. 1 illustrates, schematically, formation of electrical circuitry on individual components that are self-assembled to form an assembly including an electrical circuit that traverses each of the components.

Commonly-owned co-pending U.S. patent application Ser. No. 08/816,662, filed Mar. 13, 1997, by Bowden, et al., entitled "Self-Assembly of Macro-Scale Articles", as well as the following literature references: Bowden, et al., "Self-assembly of mesoscale objects into ordered two-dimensional arrays", Science (Washington, D.C.) (1997), 276(5310), 233-235; Terfort, et al., "Three-dimensional self-assembly of millimeter-scale components", Nature (London) (1997), 386(6621), 162-164; Bowden, et al., "Mesoscale Self-Assembly: Capillary Bonds and Negative Menisci", J. Phys. Chem. B (2000), 104(12), 2714-2724; Bowden, et al., "Molecule-Mimetic Chemistry and Mesoscale Self-Assembly", Acc. Chem. Res. (2001), 34(3), 231-238; Bowden, et al., "Self-Assembly of Microscale Objects at a Liquid/Liquid Interface through Lateral Capillary Forces", Langmuir (2001), 17(5), 1757-1765, are incorporated herein by reference. Any and all techniques used in any of these documents for self-assembly can be used, alone or in combination, with any aspects of the invention described below, alone or in combination.

The present invention provides techniques for self-assembly of electrical circuitry three-dimensionally, rather than two-dimensionally. Individual components of an overall circuit are initially in a separated, non-interconnected state and, without net external forces applied to any of the individual components in a direction of any of the other individual components, are allowed to contact each other and to fasten to each other to form a self-supporting, three-dimensional electrical circuit.

A self-supporting electrical circuit, in this context, means an electrical circuit including at least one electrically-conductive pathway that traverses portions of the circuit that had initially been at least two, individual and separate components. In preferred embodiments, an electrical pathway traverses three or more, or preferably all portions of a final three-dimensional electrical self-supporting arrangement that had been individual components prior to self-assembly. Portions of individual components, prior to self-assembly, that define an electrically-conductive pathway spanning multiple components after self-assembly can define any portion, or proportion, of the individual components. That is, an individual component can include a large electrically-conductive component that defines a large proportion of the individual component, for example greater than fifty percent of the surface area or internal structure. Or the electrically-conductive portion of the individual components can define less than forty percent, less than thirty percent, less than twenty percent, or less than ten percent of the individual component. In preferred embodiments, the component includes an electrically-conductive portion that defines but one of the above percentages or less, the remainder of the component being electrically non-conductive. An example of such a component is a polymeric structure including, on one or more (preferably a plurality) of surfaces thereof an electrically-conductive metal such as copper, or the like. Any of a variety of polymeric materials can be used as basic component structures.

"Three-dimensional", in the context of self-assembled structures of the present invention, means structures that are arranged from components that form a generally non-planar self-assembled arrangement. Preferably, a final, three-dimensional self-assembled structure is arranged such that a single plane can not be arranged in any way so as to contact all components that join to form the three-dimensional structure. For example, a generally non-planar, self-assembled arrangement includes one in which a plane can be arranged to intersect first, second, and third components that come together to form the structure, but does not intersect a fourth component of the self-assembled structure. Also in preferred embodiments, at least one component includes at least two surface contact areas that are not coplanar, and are not parallel, and at each surface contact area a separate component makes contact with and fastens to the surface contact area and defines an electrically-conductive pathway or pathways traversing the different components, and, preferably, electrically connecting all components together.

In particularly preferred embodiments a plurality of components are provided each having at least two surface contact areas, or mating surfaces, that are essentially flat, at least one component including three or more surface contact areas that are essentially flat. In each component, each surface contact area is preferably non-coplanar with all other surface contact areas and is parallel with respect to no more than one other surface contact area. The surface contact areas of at least one of the components define at least three different, non-parallel planes, and can comprise four, five, or more non-parallel, different planes. Examples of shapes of components useful in the invention include polyhedra. In such arrangements, many components can fasten to a single component at different surface contact areas, or mating surfaces, and, where this is the case for many of the components, highly-complex structures can be formed.

Self-assembled structures of the invention are useful for a variety of purposes, including light-emitting diodes such as those described below.

The components, and the electrical circuitry associated with the components and with the final, three-dimensional, self-assembled structure can be of a variety of sizes. The self-assembled structures of the invention find particular use at a small scale, where at least one individual component includes a maximum dimension of no more than about two centimeters, preferably no more than about one centimeter, more preferably still no more than about eight millimeters, and in some embodiments, no more than about five millimeters. In preferred embodiments at least two components, or preferably three, four, five, eight, or ten components each include a maximum dimension of one of the above preferred dimensions and joined together to form at least one electrical circuit that traverses at least one portion of the components.

As mentioned, the present invention involves self-assembly of components into three-dimensional, self-supporting structures in the absence of external net force applied. As used herein, "external net force" is meant to define a non-random force applied to a self-assembling component, in the direction of a second self-assembling component, for a period of time sufficient to cause the components to mate. Examples of non-random, external net forces include a mechanical force applied to a component selectively, application of an electric or magnetic field to a component susceptible to such a field, the use of gravity to cause self-assembly to occur, and the like. Self-assembly can be facilitated by application to a system of energy that does not constitute an external net force, as defined above, for example agitation of a system allowing random component/component interactions leading to self-assembly as described herein. In another aspect, no energy is applied to a system of components and self-assembly occurs spontaneously over time.

In some embodiments individual components include contact surface areas that are non-distinguishable by other components, that is, a second component can contact any of a number of contact surface areas of a first component with equal likelihood, and equal energy associated with contact. In other embodiments the first component may include two or more contact surface areas, but only one of the contact surface areas is constructed and arranged to mate with a contact surface area of a second component. That is, two components may each include a plurality of surface contact areas, but each may include only one mating surface with respect to the other component. A "mating surface" in this context is a surface of a component that is shaped in a predetermined manner and/or otherwise adapted to mate selectively with a mating surface of another component. Mating surfaces also can include a chemical functionality that is attractive to its counterpart mating surface, and that does not attract other contact surface areas that are not mating contact surface areas. For example, mating contact surface areas may include complimentary adhesive, or may each be hydrophobic while other contact surface areas are hydrophilic, or vice versa. Preferably, mating surfaces promote self-assembly via reduction of free energy of the overall system, optionally alone or in combination with factors described elsewhere herein.

Individual components can be assembled to form an assembly comprising at least one electrical circuit by allowing them to contact each other under conditions that favor the juxtaposition of mating surfaces energetically, upon random interactions between components. For example, mating surfaces can be rendered hydrophobic, with other surfaces rendered hydrophilic, and in aqueous solution in the presence of random forces (e.g., random mixing or vibrational agitation), juxtaposition of the mating surfaces will be a lower-energy arrangement and will result after sufficient random component/component interactions. Alternatively, mating surfaces can be hydrophilic with remainder surfaces hydrophobic, with random interactions carried out in a hydrophobic medium. Those of ordinary skill in the art are aware of techniques for selectively modifying specific surface areas to expose a chemical functionality or physical characteristics different from surrounding areas, and allowing such components to self-assemble in an appropriately selected medium, as described in the above-referenced patent application of Bowden, et al., and literature references of Bowden, et al., Terfort, et al., Bowden, et al., and Bowden, et al., incorporated by reference. This technique can be used, optionally, in combination with processes based on capillary interactions or forces between patterns of features of mating surfaces, such as solder drops (described more fully below).

Electrical circuits result from the provision, on surfaces or within individual components, of individual portions of an overall electrical circuit. Once self-assembly of components occurs in a manner dictated by juxtaposition of mating surfaces, an overall electrical circuit spanning individual components results where individual portions of the electrical circuit are electrically connected to each other upon matching of mating surfaces of individual components.

The following general exemplary self-assembled electrical circuit will be described to illustrate one way in which the invention can be manifested. Those of ordinary skill in the art, upon reading this disclosure, will recognize other ways that electrical circuits can be created, via self-assembly, and the invention is not intended to be limited by the following description.

This example involves the formation of two fundamental classes of 3D electrical networks—parallel and serial—by self-assembly as a strategy for fabricating three-dimensional (3D) microelectronic devices. The basic component in this exemplary assembly is a polyhedron (a truncated octahedron, TO), on whose faces electrical circuits are printed. In the exemplary demonstrations, these circuits include light emitting diodes (LEDs) to demonstrate electrical connectivity and trace the networks. Although not shown, they can also include devices with more complex functionality (e.g. processors). The LEDs are wired to patterns of solder dots on adjacent faces of the polyhedron. The TO are suspended in a liquid that has approximately the same density as the components that self-assemble to form the electrical circuit. Self-assembly is carried out under set conditions that allow the mating surfaces of the components to interact and to fasten to each other irreversibly under the set conditions. That is, random interactions between the components occur until the mating surfaces contact each other and are in register with each other. Once that occurs, without a change in the conditions (i.e., continuing under the set conditions), the components are joined irreversibly unless significant net forces are applied to one or both of the components in a direction that would cause them to separate. Since the self-assembly system does not involve such net external forces, but relies upon random interactions, net forces do not exist that would separate the components. Once the components are joined, conditions can be changed to further solidify, i.e., render more permanent, interconnects between the components. For example, the temperature of the system can be changed after joinder of the mating surfaces to cause components of the mating surface to solidify relative to each other. For example, the set conditions can define a temperature at which portions of the mating surfaces under the set conditions (irreversible under the set conditions), the temperature can be reduced to solidify the liquid and further solidify the connection between the mating surfaces. This further solidification can result in an assembly that is irreversible, i.e. individual components do not become detached from each other, even in the presence of net external forces that would otherwise cause them to separate. For example, the TO can be suspended in an approximately isodense liquid at a temperature above the melting point of the solder ($T_m \sim 47°$ C.), and allowed to tumble gently into contact with one another. The drops of molten solder fuse, and the minimization of their interfacial free energy generates the forces that assemble the TO into regular structures.

The function and advantage of these and other embodiments of the present invention will be more fully understood from the examples below. The following examples are intended to illustrate the benefits of the present invention, but do not exemplify the full scope of the invention.

EXAMPLES

Processes based on capillary interactions between solder drops have been used previously to assemble electronic and mechanical structures: examples include "flip-chip" technology (Miller/IBM *J. Res. Develop.*, 239 (May 1969)), and the rotation of parts of microstructures into non-planar orientations (R. R. A. Syms, E. M. Yeatman, *Electronics Letters* 29, 662 (1993); F. K. Harsh, V. M. Bright, Y. C. Lee, Y., *Sens. Actuators* A77, 237 (1999)). During assembly, recognition of the pattern of dots on one face by that on another orients and registers the patterns, and results in well-defined pattern of dot-on-dot electrical connections between different polyhedra. With appropriate designs, self-assembly of polyhedra can generate networks in which the LEDs are connected either in parallel or in series.

Fabrication: FIG. 1 outlines both the fabrication of the patterned polyhedra and their self-assembly into 3D structures that includes electrical networks. (A) An array of the basic pattern of copper dots 18, contact pads 28 and wires 19 was defined on a flexible copper/polyimide sheet 20 using photolithography and etching. (B) Resulting pattern elements 22 were cut out along the dotted line as shown, (C) glued on the faces of polyhedra 24, and (D) LEDs 26 were manually soldered on the contact pads. (E) The copper dots and wires on the TO were coated with solder, and self-assembly 28 of the pattern elements occurred in a hot, isodense, aqueous KBr solution, that was agitated by rotation.

Masters for forming the polyhedra were machined out of aluminum, and molds were made from these masters using poly (dimethyl siloxane) (PDMS Sylgard 184, Dow Corning). Polymeric polyhedra were then cast in these molds using a photocurable polyurethane polymer (NOA 73, Norland). A sheet of flexible copper-polyimide composite (Pyralux LF 9110, DuPont) was coated with a photoresist (Microposit, 1813, Shipley) using hexamethyldimethylsiloxane (HMDS) as a primer. Both were spun on at 4000 rpm. After a soft-bake at 115° C. (5 min), this sheet was exposed to UV light through a negative mask containing an array of the pattern of connector dots, contact pads and wires. The exposed photoresist was developed and the exposed copper was removed by etching with an aqueous ferric chloride solution (1.4 g $FeCl_3$/mL of $H_2O$). Unexposed photoresist was removed with acetone. The basic pattern was then cut out manually and glued (Krazy glue, Elmer's Products) to the faces of the polyhedra. In the demonstrations of parallel and serial networks, LEDs (BL-HS136, American Bright Optoelectronics Corp.) were manually soldered (Rosin Core Solder, Radio Shack, m.p. ~185° C.) onto the copper contact pads. These soldered regions were coated with a thin impervious layer of adhesive (CA-50 Gel, 3M) to avoid wetting and cohesion of these regions during assembly. The adhesive was allowed to harden completely over 48 hours. The polyhedra were then immersed in a bismuth solder (117, Small Parts Inc. m.p. ~47° C.) which was melted in an aqueous solution of hydrochloric acid (pH ~1). The acid dissolved the oxide layer on the copper and the solder. The solder coated only the exposed copper regions on the polyhedra (dots and wires), but did not wet the polymeric surfaces. The solder-coated polyhedra were allowed to self-assemble in an aqueous KBr solution [density 1.1-1.4 $g/cm^3$, pH 3-4 adjusted with acetic acid (to dissolve oxides on the solder; a function similar to that of flux in conventional soldering), ~0.001% (v/v) of soap (Triton-X100, Aldrich, to prevent the formation of bubbles at the surface of the polyhedra)], in an indented round-bottomed flask, heated above the melting point of the solder (~70° C.) in an oil bath. The flask was placed horizontally on a rotary evaporator that was rotated at 5-20 rpm. All self-assemblies were completed within an hour. The assemblies were rotated for an average of fifteen minutes after they formed, at which time the assembly was allowed to cool. The last fifteen minutes may serve to anneal the structure to correct errors in the connections. On cooling, the molten solder interconnects solidified, and gave the aggregates sufficient strength that they could be manipulated.

Figure 2:
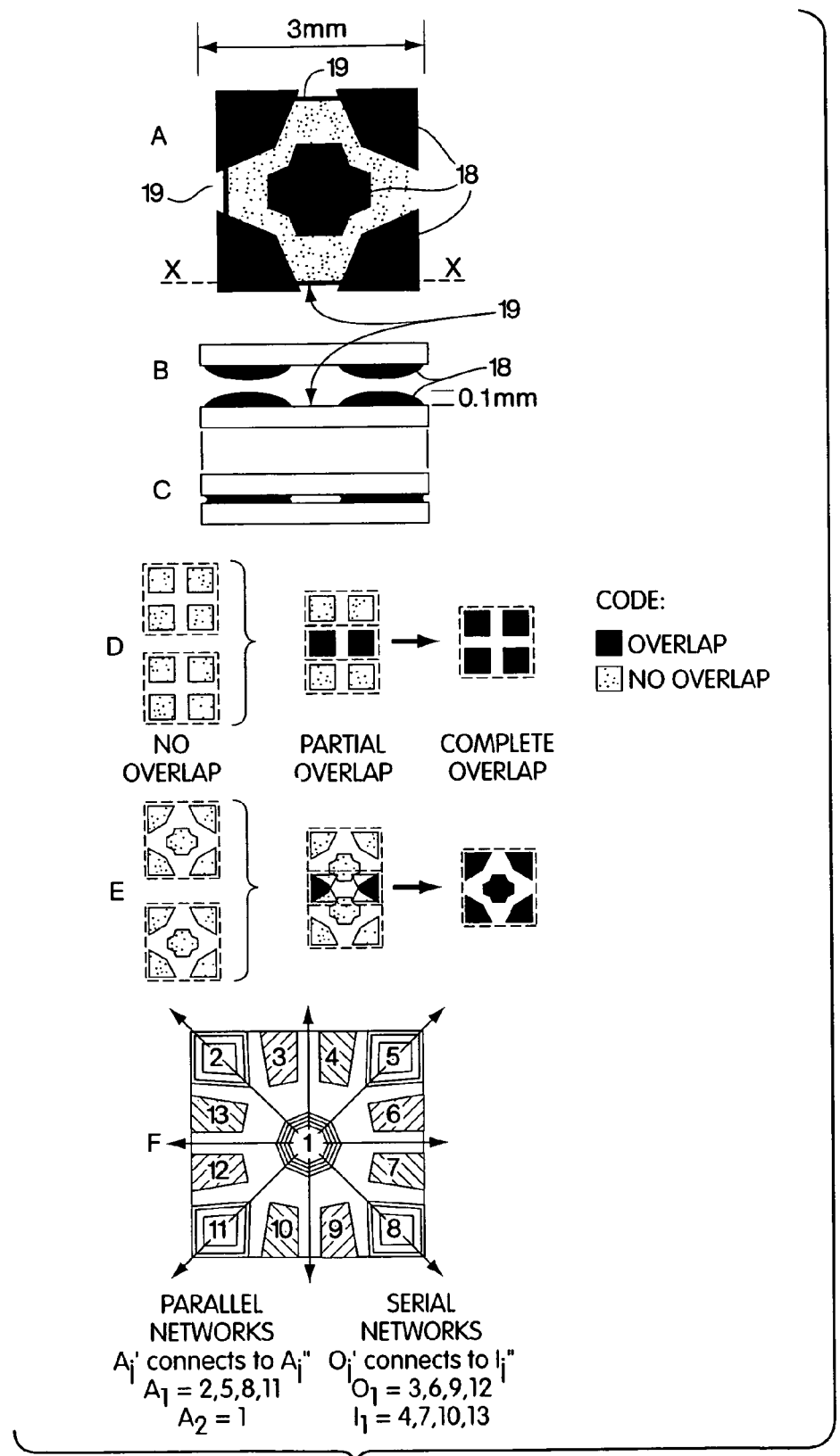
FIG. 2 illustrates, schematically, joinder of individual components via mating surfaces; and, FIG. 3 illustrates, schematically, articles assembled in accordance with the invention and electrical circuitry defined thereby.

Solder patterns: A scheme was used in which LEDs were mounted on the hexagonal faces of the TO, and solder dots were placed on the square faces. To maximize the rate of self-assembly, all of the square faces of the TO had the same four-fold symmetry pattern of solder dots, defining a mating surface. With this pattern, perfect registration of patterns on juxtaposed faces occurred in one of four indistinguishable ways; dots on the patterns that transformed into each other under four-fold rotational symmetry were equivalent, and served the same function. On the 3 mm×3 mm square face, the width of all of the solder dots was ~1 mm. Referring to FIG. 2, (A) The widths of all the dots 18 in the patterns used were approximately the same, while the width of the wires 19 was much smaller. (B) A cross-sectional view (Section XX' in (A)) of two assembling faces. The height of the solder coating the wires is ~15% that on the dots. (C) When the faces connect, the solder dots fuse with each other, while the wires between them do not touch. (D-E) The principle used to design patterns of solder dots that connect with weak local minima. The dotted lines represent the boundaries of the individual patterns. (D) This pattern—four square dots—can assemble with complete overlap of only two of the four dots, and generate a relatively stable but misaligned structure. (E) Complete overlap of individual dots in this pattern cannot occur unless all the dots are correctly aligned defining an energy minimum. (F) A pattern comprising dots that can be used for both parallel and serial networks.

A common size was preferred: the solder wetted the copper with a well-defined contact angle, and each drop therefore had the same height. Empirical testing suggested that the optimum distance between adjacent solder dots was approximately one-half their width. Smaller separations resulted in electrical shorting between dots due to bridging with solder; larger separations resulted in misalignment. We designed the pattern of solder dots to give an energy diagram for self-assembly having one large (global) minimum, and relatively weak local minima (FIGS. 2, D and E).

Wires: The wires that connect different solder dots electrically on each TO were fabricated in the same way as the dots. When the patterned TO were dipped in solder, these wires were also covered with a solder layer. By making the wires substantially narrower (~150 μm) than the diameter of the dots (~1 mm), the height of the solder film on the wires was limited to ~15% that on the dots. When the faces self-assembled, the larger dots fused into connections, but the smaller wires did not touch and fuse (FIG. 2,C). It was, as a result, unnecessary to insulate the wires to prevent shorting, even when they crossed on juxtaposed faces of two TO.

Architecture: These examples demonstrate, by self-assembly in 3D, networks that are widely used in current 2D integrated circuit technology. In these systems, pins on processors belong to one of three groups: buses ($A_1', \ldots, A_n'$; driving voltage, clock), inputs ($I_1', \ldots, I_m'$), and outputs ($O_1', \ldots, O_m'$). Bus lines connect processors in parallel ($A_j' \leftrightarrows A_j''$, $j=1, \ldots, n$) while outputs of one processor connect serially to inputs of adjacent processors and, vice versa ($O_j' \leftrightarrows I_j''$, $j=1, \ldots, m$).

In the pattern of solder dots shown in FIG. 2, F, the five dots (1, 2, 5, 8 and 11) lie on reflection axes; and provide two sets of dots (based on four fold rotational symmetry; {1} and {2, 5, 8 and 11}). During self-assembly, dots from one set on a TO connect to dots from the same set on another TO. These dots are used for parallel or bus line connections. The other dots: {3, 6, 9 and 12} and {4, 7, 10 and 13} form two sets based on their four-fold rotational symmetry. Dots from the first set are related to dots from the second set by reflection symmetry. On assembly, dots from one set on a TO (e.g. outputs from one processor) connect to those from the other set on another TO (e.g. inputs to a second processor). These dots are used for serial, I/O connections.

Figure 3:
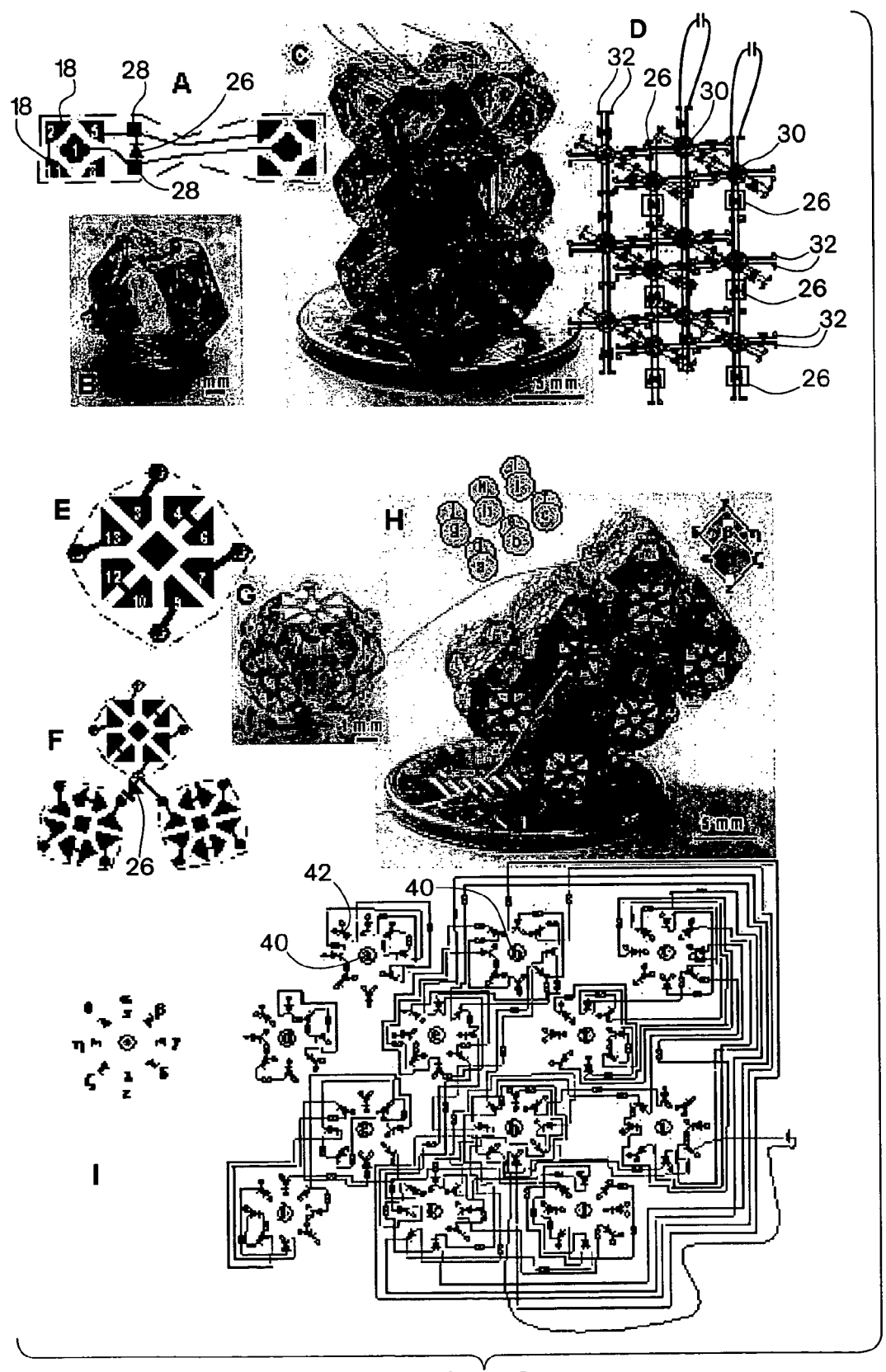

Parallel Networks (Buses): FIG. 3 (A-D) shows the realization of a 3D network with parallel connectivity, using self-assembly. In the assembled aggregate, LEDs on one TO connected to those on the adjacent TO in parallel, along three orthogonal directions. The fidelity of the interconnects was visualized by lighting up the LEDs connected in parallel in the assembly. This self-assembled, 3D parallel network mimicked bus lines in circuits in which a number of electrical components are powered by the same common wires.

Serial Networks (I/O connections): FIG. 3 (E-I) shows the realization of a 3D network with serial connectivity, using self-assembly. (A) The basic pattern of copper dots 18, wires 19 and contact pads 28 used. The solder dots included dots 2, 5, 8, 11 and 1 (FIG. 2, F), that lie on the axes of symmetry of the square face. Two electrically isolated wires connected the two sets. A LED 26 was soldered on the contact pads between the wires using a polarity in which the cathode is connected to the wire between the dots 2, 5, 8 and 11, and the anode was connected to the wire between dots 1. (B) The pattern was glued on the TO 24 in such a way that the copper dots covered two opposite square faces, while the two wires ran across the two hexagonal faces between them. There are three LEDs 26 on each TO 28. (C) A photocopy of a photograph of the self-assembled aggregate on a penny (to provide a size prospective). Two electrically isolated pairs of wires were connected to a battery to visualize electrical continuity in the aggregate: The illuminated loop comprises six LEDs 26 that consist of two sets of LEDs (three in each set) that connect in parallel. (D) An electrical circuit diagram showing the parallel network formed. The circles 30 show the position of the centers of each of the 12 TOs. The half circles 32 represent connection dots at the assembling faces of two TO. The LEDs 26 are shown as well. Assembly results in the formation of 16 pairs of wires, which include of four, six and six pairs in each of the three dimensions. The six LEDs that are lit up are highlighted by black squares. (E-I) A self-assembled 2×2×3 aggregate containing 12 TO and demonstrating serial connectivity. (E) The pattern of solder dots containing a pair of the dots 3, 6, 9, 12 and 4, 7, 10, 13 (FIG. 2, F) that do not lie on the axes of symmetry of the square face. Dots 4, 6 and 10, 12 are connected to each other, while dots 3, 9 and 7, 13 are wired to contact pads. (F) The terminals of a single LED are directly soldered across two contact pads, and a wire is soldered in a way that connects the third contact pad to one of one of the terminals of the LED, using a polarity in which the anode of the LED connects to dots from the set 3, 9 and the cathode connects to dots from the set 7, 13. (G) A pattern TO prior to assembly. The TO contains eight LEDs, one on each of its hexagonal faces, with the six square faces covered with the pattern of connector dots. (H) A 2×2×3 self-assembled aggregate with 96 LEDs (with a penny for perspective). The 12 polyhedra are labeled a through l. The eight LEDs on each TO are labeled α through θ. The LEDs on different TO connect to each other in serial loops of various sizes. The loops were traced by powering pairs of leads: Individual loops range in size from those containing two LEDs to one that contains ten LEDs; the latter is illuminated. (I) The circuit diagram of the serial network aggregate shown in (H). The circles 40 represent individual polyhedra, and the triangles 42 represent the LEDs. The 96 LEDs (eight on each polyhedron) connect cathode to anode in all loops. The lines and diodes represent the loop containing ten LEDs that is lit up using a battery (H).

In order to reduce the number of circuits that would be formed (and of LEDs required to check their electrical connectivity), and to minimize the geometrical problems of packing the LEDs in the arrays, only four of the dots ("active" dots) in the solder pattern ({3, 9} {and {7, 13}) were wired to LEDs. The other four dots ({6, 12} and {4, 10}) were connected to each other ("passive" dots). The active and passive dots had two-fold symmetry, while the global pattern on individual connector dots on the assembling square faces had four-fold symmetry. This difference in symmetry resulted in the formation of a stochastic network on self-assembly (if a deterministic network were required, all the dots ({3, 6, 9 and 12} and {4, 7, 10 and 13}) would need to be connected to LEDs). There are three types of connections which result from overlap of dots at each assembling face (a) connections between LEDs on different TO, involving only active dots with a probability of one-fourth (b) connections between LEDs on the same TO, involving both active and passive dots with a probability of one-half and (c) connections containing no LEDs, involving only passive dots with a probability of one-fourth. The important feature of the assembled 3D network was that the cathode of one LED always connected to the anode of another LED across the assembling faces. This connectivity was visualized by lighting up the serial loops in the assembly; FIG. 3H shows one loop containing ten LEDs. In bipolar, random system, the probability of the anode connecting to the cathode is one-half. For ten LEDs to form a functional serial loop, the probability would be $\frac{1}{2}^9$ or $\frac{1}{512}$. The serial connectivity in this architecture mimicked I/O connections in integrated circuits.

This system—using capillary forces between patterns of solder drops to form interconnections between different electrical components in 3D—provides a foundation for the self-assembly of 3D, multicomponent electronic devices. The 3D assemblies can be designed to be porous: This porosity may allow for cooling fluid to be pumped through the assemblies. The shape of the distribution of solder dots on the assembling faces raises interesting questions regarding the "recognition" of one pattern by another.

Although these examples demonstrate parallel and serial connectivity separately, it is possible to extend these ideas to more complex networks involving different combinations of parallel and serial connections. The LEDs in our demonstrations represents simple bipolar electronic devices; in order to fabricate 3D computational devices, elements of digital logic (e.g. five-pin single logic gates (five-pin, single logic gates are part of the Little Logic™ line of products sold by Texas Instruments) can be incorporated into the 3D assemblies. The strategy of self-assembling networks facilitates the formation of a high degree of interconnection between individual processing elements in determining ways.

Those skilled in the art would readily appreciate that all parameters listed herein are meant to be exemplary and that actual parameters will depend upon the specific application for which the methods and apparatus of the present invention are used. It is, therefore, to be understood that the foregoing embodiments are presented by way of example only and that, within the scope of the appended claims and equivalents thereto, the invention may be practiced otherwise than as specifically described. Specifically, those of ordinary skill in the art will recognize, or be able to ascertain using no more than routine experimentation, many equivalents to the specific embodiments of the invention described herein. Such equivalent are intended to be encompassed by the following claims.

In the claims, all transitional phrases such as "comprising", "including", "carrying", "having", "containing", "involving", and the like are to be understood to be open-ended, i.e. to mean including but not limited to. Only the transitional phrases "consisting of" and "consisting essentially of", respectively, shall be closed or semi-closed transitional phrases as set forth in the United States Patent Office Manual of Patent Examining Procedures, section 2111.03.

What is claimed is:

1. An article comprising a non-planar assembly of at least a first, a second, a third, and a fourth component that together define an electrical circuit traversing at least one portion of each of the first, second, third, and fourth components, wherein the first, second, third, and fourth components are constructed and arranged to have the ability, individually, in the absence of any external net force applied to any of the first, second, third, or fourth components in the direction of any others of the first, second, third, or fourth components, to form the assembly.

2. An article as in claim 1, the component articles each having a dimension of at least about 250 nm.

3. An article as in claim 1, the component articles each having a dimension of at least about 500 nm.

4. An article as in claim 1, comprising a self-assembled composite of at least five separate component circuit articles.

5. An article as in claim 1, wherein at least one of the separate component circuit articles has a dimension of at least 150 nm.

6. An article as in claim 1, wherein at least two of the component articles have dimensions of at least one micron.

7. An article as in claim 1, wherein at least one of the first, second, third, or fourth components is rotationally symmetric.

8. An article, comprising:
an electrical circuit, having integrated circuit connectivity, the electrical circuit comprising at least first, second, and third components intersected by a first plane, and fourth, fifth, and sixth components intersected by a second plane that is not coplanar with the first plane, wherein a single plane cannot be arranged in any way so as to contact each of the first, second, third, fourth, fifth, and sixth components, the electrical circuit traversing at least one portion of each of the first, second, third, fourth, fifth, and sixth components, wherein the first, second, third, fourth, fifth, and sixth components are constructed and arranged to have the ability, individually, in the absence of any external net force applied to any of the first, second, third, fourth, fifth, or sixth components in the direction of any others of the first, second, third, fourth, fifth, or sixth components, to form the electrical circuit.

9. The article of claim 8, wherein each of the first, second, third, fourth, fifth, and sixth components comprises a diode.

10. The article of claim 8, wherein each of the first, second, third, fourth, fifth, and sixth components comprises a processor.

11. The article of claim 8, wherein each of the first, second, third, fourth, fifth, and sixth components comprises an electrical device.

12. An article, comprising:
an electrical circuit, having integrated circuit connectivity, the electrical circuit comprising at least first, second, and third components intersected by a first plane, and fourth, fifth, and sixth components intersected by a second plane that is not coplanar with the first plane, wherein a single plane cannot be arranged in any way so as to contact each of the first, second, third, fourth, fifth, and sixth components, the electrical circuit traversing at least one portion of each of the first, second, third, fourth, fifth, and sixth components, wherein the first, second, third, fourth, fifth, and sixth components are constructed and arranged to have the ability, individually, in the absence of any external net force applied to any of the first, second, third, fourth, fifth, or sixth components in the direction of any others of the first, second, third, fourth, fifth, or sixth components, to form the electrical circuit,
the electrical circuit having a porous structure, wherein at least some pores are defined between components,
each of the first, second, third, fourth, fifth, and sixth components comprising a surface contact area for connection to another component, each surface contact area exhibiting rotational symmetry and a local free energy minima configuration that enhances alignment of the surface contact area to the surface contact area of another component and the electrical connectors thereon, and
each surface contact area comprising a first set of electrical connectors and a second set of electrical connectors such that any two of the first, second, third, fourth, fifth, and sixth components are joinable in a plurality of electrically indistinguishable configurations wherein, in each of the indistinguishable configurations, at least one of the first set of electrical connectors on the first component joins to at least one of the second set of electrical connectors on the second component and at least one of the second set of electrical connectors on the first component joins to at least one of the first set of electrical connectors on the second component.

13. The article of claim 12, wherein each surface contact area is constructed such that, in at least two different rotational orientations of two of the components relative to each other, around an axis passing through surface contact areas of each at which they are joined, a functionally identical electrical connection between the two components is formed; and wherein each of the components comprises a plurality of surface contact areas and is constructed such that it is able to connect to another component via either of at least two of its surface contact areas in an electrically and structurally indistinguishable manner.

14. The article of claim 12, wherein the electrical connectors of each surface contact area are arranged on the surface contact area in a rotationally symmetric manner; and wherein each of the components comprises a plurality of surface contact areas and is constructed such that it is able to connect to another component via either of at least two of its surface contact areas in an electrically and structurally indistinguishable manner.

15. The article of claim 12, wherein at least some pores have a shape sufficient to allow a fluid to pass therethrough.

16. The article of claim 12, further comprising a cooling fluid within at least some of the pores.

17. The article of claim 12, wherein the first set of electrical connectors on the first component and the second set of electrical connectors on the second component are able to join to form a parallel circuit.

18. The article of claim 12, wherein the first set of electrical connectors on the first component and the second set of electrical connectors on the second component are able to join to form a series circuit.

19. The article of claim 12, wherein the first set of electrical connectors forms an I/O connection.

20. The article of claim 12, wherein the first set of electrical connectors forms a bus.

\* \* \* \* \*